US012770835B2

(12) United States Patent
Xu et al.

(10) Patent No.: US 12,770,835 B2
(45) Date of Patent: Oct. 20, 2026

(54) COATED PART FOR PLASMA PROCESSING CHAMBER

(71) Applicant: Lam Research Corporation, Fremont, CA (US)

(72) Inventors: Lin Xu, Fremont, CA (US); Satish Srinivasan, Newark, CA (US); David Joseph Wetzel, Santa Clara, CA (US); Scott Briggs, Menlo Park, CA (US); Andrew D. Bailey, III, Milpitas, CA (US); Yiwei Song, San Jose, CA (US); Michael Julius Kinsler, San Jose, CA (US); John Michael Kerns, Livermore, CA (US); Lei Liu, Fremont, CA (US); Robin Koshy, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 249 days.

(21) Appl. No.: 18/703,268

(22) PCT Filed: Sep. 29, 2022

(86) PCT No.: PCT/US2022/045204
§ 371 (c)(1),
(2) Date: Apr. 19, 2024

(87) PCT Pub. No.: WO2023/086165
PCT Pub. Date: May 19, 2023

(65) Prior Publication Data

US 2025/0246413 A1 Jul. 31, 2025

Related U.S. Application Data

(60) Provisional application No. 63/277,282, filed on Nov. 9, 2021.

(51) Int. Cl.
*H01J 9/02* (2006.01)
*H01J 37/32* (2006.01)

(52) U.S. Cl.
CPC .......... *H01J 37/32559* (2013.01); *H01J 9/02* (2013.01); *H01J 37/32091* (2013.01);
(Continued)

(58) Field of Classification Search
CPC ................................................ H01J 37/32559
(Continued)

(56) References Cited

U.S. PATENT DOCUMENTS 9,790,582 B2 10/2017 Liu et al.
2006/0254716 A1 11/2006 Mosden et al.
(Continued)

FOREIGN PATENT DOCUMENTS

JP 2016-208034 12/2016
TW 200539243 12/2005
(Continued)

OTHER PUBLICATIONS

International Search Report and Written Opinion from International Application No. PCT/US2022/045204 dated Jan. 27, 2023.
(Continued)

*Primary Examiner* — Christopher M Raabe
(74) *Attorney, Agent, or Firm* — Beyer Law Group LLP

(57) ABSTRACT

An apparatus for processing a substrate is provided. A capacitively coupled plasma electrode is within a capacitively coupled plasma processing chamber. A plasma confinement component is within the capacitively coupled plasma processing chamber, wherein at least one of the capacitively coupled plasma electrode and plasma confine-
(Continued)

ment component comprises a metal component body with a plasma facing surface and a plasma spray coating over the plasma facing surface.

14 Claims, 4 Drawing Sheets

(52) U.S. Cl.
CPC ..... *H01J 37/3255* (2013.01); *H01J 2209/012* (2013.01); *H01J 2237/0213* (2013.01)

(58) Field of Classification Search
USPC ............................................................ 445/46
See application file for complete search history.

(56) References Cited

U.S. PATENT DOCUMENTS

2013/0288037 A1 10/2013 Sun et al.
2014/0118880 A1 5/2014 He et al.
2014/0315392 A1* 10/2014 Xu .................... H01J 37/32477 428/685
2016/0312351 A1 10/2016 Liu et al.
2017/0241038 A1 8/2017 He et al.
2019/0338408 A1 11/2019 He et al.

FOREIGN PATENT DOCUMENTS

TW 200616039 5/2006
WO 2021/167897 8/2021

OTHER PUBLICATIONS

Korean Office Action from Korean Application No. 10-2024-7018802 dated Jan. 26, 2026 with Machine Translation.
Taiwanese Office Action from Taiwanese Application No. 111142353 dated Jun. 12, 2026 with Machine Translation.
Japanese Office Action from Japanese Application No. 2024-526499 dated Jun. 16, 2026 with Machine Translation.

* cited by examiner

COATED PART FOR PLASMA PROCESSING CHAMBER

CROSS-REFERENCE TO RELATED APPLICATION

This application claims the benefit of priority of U.S. Application No. 63/277,282, filed Nov. 9, 2021, which is incorporated herein by reference for all purposes.

BACKGROUND

The background description provided here is for the purpose of generally presenting the context of the disclosure. Information described in this background section, as well as aspects of the description that may not otherwise qualify as prior art at the time of filing, are neither expressly nor impliedly admitted as prior art against the present disclosure.

The disclosure relates to capacitively coupled plasma processing devices. More specifically, the disclosure relates to parts or methods of providing parts for use in capacitively coupled plasma processing devices.

Capacitively coupled plasma processing devices have plasma facing surfaces that are subjected to voltages that erode the plasma facing surface. As a result, many capacitively coupled plasma processing devices have plasma facing surfaces of silicon since the erosion of silicon forms a volatile byproduct that does not contaminate the process. The erosion of the plasma facing surface requires periodic replacement of parts of the capacitively coupled plasma processing devices. In addition, erosion of the plasma facing surface causes process drift.

SUMMARY

To achieve the foregoing and in accordance with the purpose of the present disclosure, an apparatus for processing a substrate is provided. A capacitively coupled plasma electrode is within a capacitively coupled plasma processing chamber. A plasma confinement component is within the capacitively coupled plasma processing chamber, wherein at least one of the capacitively coupled plasma electrode and plasma confinement component comprises a metal component body with a plasma facing surface and a plasma spray coating over the plasma facing surface.

In another manifestation, a method for forming and using a plasma confinement component for a capacitively coupled plasma processing chamber is provided. A metal component body has a plasma facing surface. A coating is plasma sprayed over the plasma facing surface.

These and other features of the present disclosure will be described in more detail below in the detailed description and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION

Figure 1:
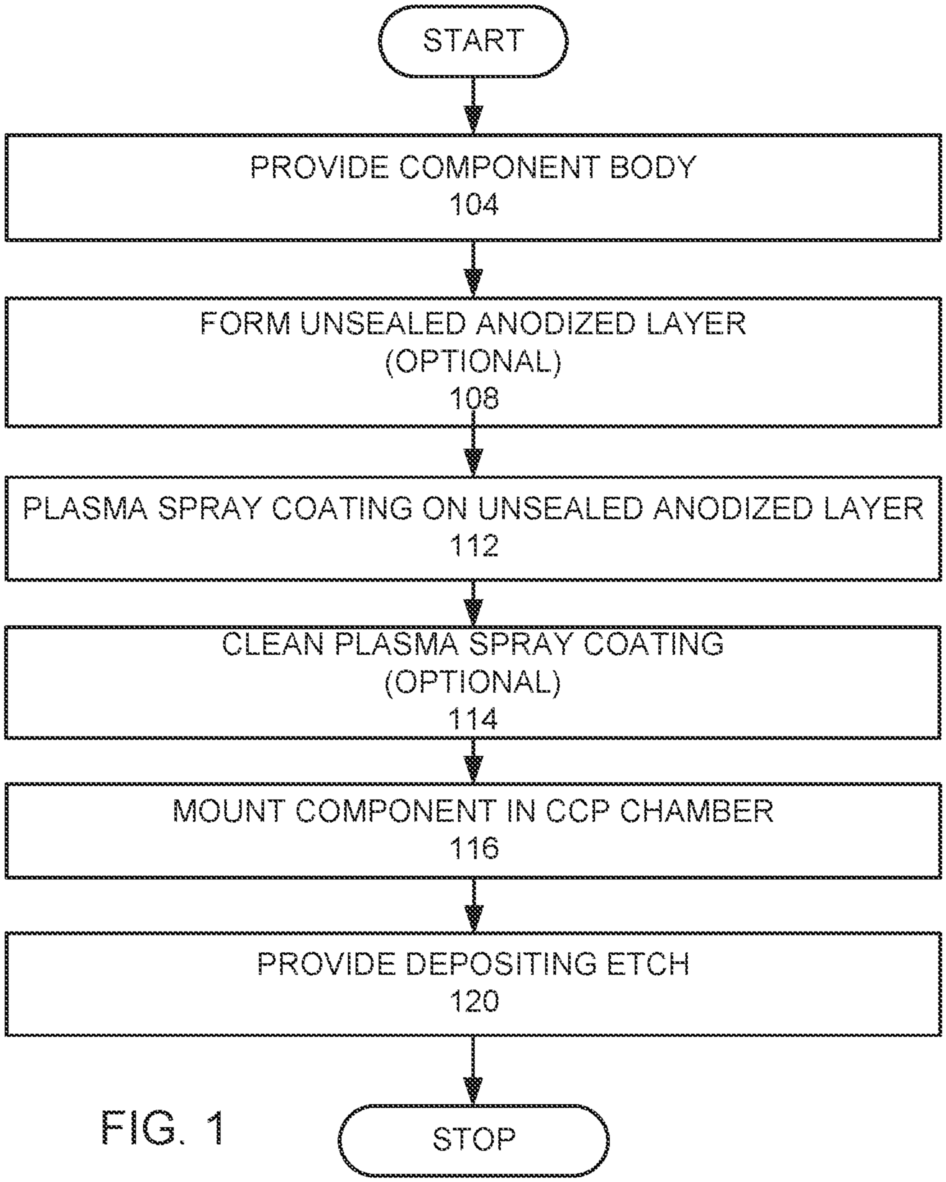
FIG. 1 is a flow chart of an embodiment.

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well-known process steps and/or structures have not been described in detail in order to not unnecessarily obscure the present disclosure.

Capacitively coupled plasma (CCP) processing devices have plasma facing surfaces that are subjected to voltages that erode the plasma facing surface. As a result, many plasma processing devices have plasma facing surfaces of silicon, since the erosion of silicon forms volatile byproducts that may be pumped away instead of contaminating the process. The erosion of the plasma facing surface requires periodic replacement of parts of the capacitively coupled plasma processing devices and causes process drift.

In addition, the roughness of the silicon surface is not easily controlled and maintained. If the surface roughness of a plasma facing surface of a component can be controlled and maintained the surface roughness may be tuned to increase the adhesion of deposition on the surface. Such deposition may be polymer byproducts formed by the plasma process. The increase of the adhesion of deposition on the surface reduces flaking and contamination from the deposition, thus reducing defects.

In inductively coupled plasma processing chambers coatings are subjected to much lower voltages than coatings in CCP processing chambers. Because the components in the CCP processing chambers are subjected to much higher voltages in a range from 100 eV to 400 eV, it is expected that the plasma facing surface of the component will erode.

Aluminum is a lightweight, inexpensive, and electrically conductive material for forming chamber components. However, aluminum may be a contaminant that increases defects in resulting semiconductor devices. Since it is expected that the plasma facing surface of a CCP plasma processing chamber will be eroded aluminum containing components with a plasma facing surface has been avoided for CCP processing chambers.

Previously, yttria containing coatings to protect parts for capacitively coupled plasma processing devices were avoided, since yttria containing coatings subjected to high voltages would erode forming yttria particles, since yttria does not form a volatile byproduct. Such yttria particles would contaminate the plasma process. In addition, exposure of yttria to a fluorine containing plasma may cause the yttria to erode.

CCP processing chambers have plasma confinement components. Such plasma confinement components have plasma facing surfaces that help confine and/or direct the flow of plasma. Such plasma confinement components may include, electrodes, confinement rings, and various types of liners, such as high flow liners and/or C-shrouds. For CCP processing chambers some of the plasma confinement components are made of silicon and are consumable parts since the plasma erodes the silicon. The erosion of the part causes process drift and increases the cost of ownership since the consumable parts must be replaced. In addition, the surface roughness of the component is changed as the component is eroded. An embodiment provides CCP processing chambers with plasma confinement components that are more etch resistant. The electrodes used for capacitive coupling may also be exposed to plasma and are subject to erosion and byproduct deposition. When the electrodes are above the substrate, the byproduct deposited on the electrode may flake off and fall on the substrate providing a contaminant.

Figure 2A:
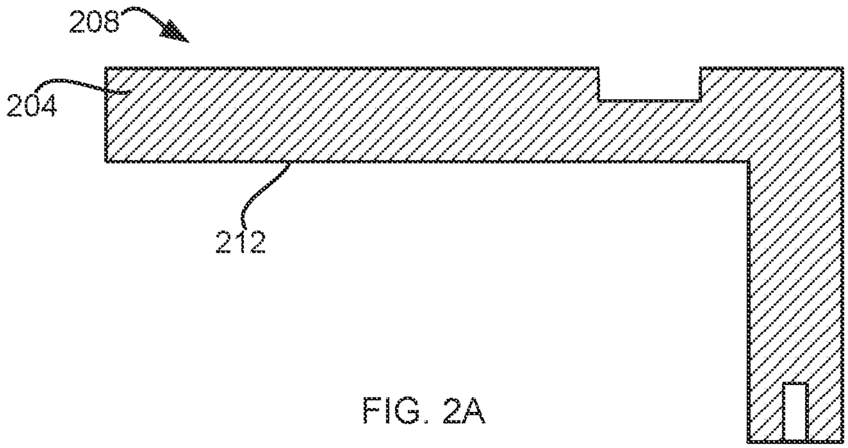
FIGS. 2A-D are schematic cross-sectional views of a part formed according to an embodiment.

In order to facilitate understanding, FIG. 1 is a flow chart of an embodiment. A metal, such as aluminum, component body is provided (step 104). The aluminum component body is made of pure aluminum or an aluminum alloy, such as aluminum 6061. In an example, FIG. 2A is a cross-sectional schematic view of a section of an aluminum component body 204 of a component 208. In this example, the aluminum component body 204 is part of a C-shroud of a CCP processing system. The aluminum component body 204 is made of aluminum 6061. The aluminum component body 204 has a plasma facing surface 212. An optional grit blasting of the plasma facing surface 212 may be used to increase the adhesion of the plasma facing surface 212.

Figure 2B:
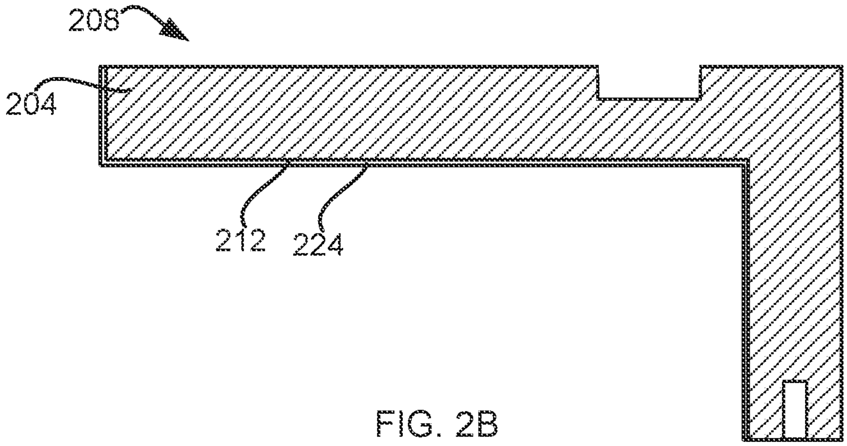

Next, an unsealed anodized layer is formed on the plasma facing surface 212 of the aluminum component body 204 (step 108). In this embodiment, the formation of the unsealed anodized layer (step 108) comprises a Type III anodization process (also referred to as hard anodization or hard-coat anodization), wherein the aluminum component body 204 is subjected to a sulfuric bath at a temperature of 0° C. to 3° C. and high voltage (up to 100V) to create the oxide or "anodized" layer. The hard anodization process produces an anodized layer 224, as shown in FIG. 2B, with a thickness up to or greater than about 50 μm. The anodized layer 224 is not shown to scale, in order to better illustrate the anodized layer 224. In this embodiment, no water seal or other hydrothermal or precipitation means is performed after the anodization since such a seal has a higher likelihood of cracking or degrading from the plasma process.

In some embodiments, the anodized layer 224 is at least 10 μm thick and can be as thick as 100 μm. In other embodiments, the anodized layer 224 has a thickness in the range of 20 μm and 50 μm. In a further embodiment, the anodized layer 224 has a thickness in the range of 25 μm and 35 μm, According to an embodiment, the anodized layer 224 is an aluminum oxide layer with a purity of at least 99% aluminum oxide by mass. According to another embodiment, the anodized layer 224 is an aluminum oxide layer with a purity of at least 99.5% aluminum oxide by mass. According to yet another embodiment, the anodized layer 224 is an aluminum oxide layer with a purity of at least 99.9% aluminum oxide by mass. The anodized layer 224 has a porosity of not more than 0.5% by volume. In some embodiments, the porosity of the anodized layer 224 is in a range of 0.1%-0.5% by volume.

Next, a plasma spray coating is deposited on the unsealed anodized layer (step 112). In this embodiment, the plasma spray coating forms a yttrium aluminum oxide coating. Plasma spraying, also called thermal spraying, is a coating process in which a torch is formed by applying an electrical potential between two electrodes, leading to the ionization of an accelerated gas (a plasma). Torches of this type can readily reach temperatures of thousands of degrees Celsius, liquefying high melting point materials such as ceramics. In a plasma spray head, particles of the desired materials, in this embodiment yttrium aluminum oxide powder, are injected into the jet, melted, and then accelerated towards the substrate so that the molten or plasticized material coats the surface of the component and cools, forming a solid, conformal coating. These processes are distinct from vapor deposition processes that use vaporized material instead of molten material. In this embodiment, the plasma spray coating comprises a mixture of crystalline and amorphous yttrium aluminum garnet ($Y_3Al_5O_{12}$ (YAG)). In some embodiments, the plasma spray coating further comprises yttrium aluminum monoclinic ($Y_4Al_2O_9$ (YAM)) or yttrium aluminum perovskite ($YAlO_3$ (YAP)). In general, an yttrium aluminum oxide coating may be of any yttrium aluminum oxide material, such as at least one of YAG, YAM, and YAP.

Figure 2C:
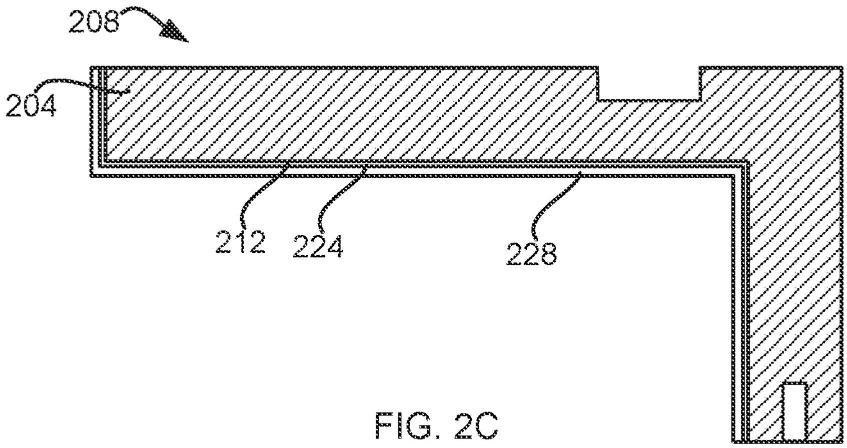

FIG. 2C is a cross-sectional schematic view of the section of the aluminum component body 204 of the component 208 with the anodized layer 224 and the plasma spray coating 228 on the anodized layer 224. In this embodiment, the plasma spray coating 228 has a thickness of 50 μm to 200 μm inclusive and a roughness of 2 μm to 10 μm RA inclusive.

Figure 2D:
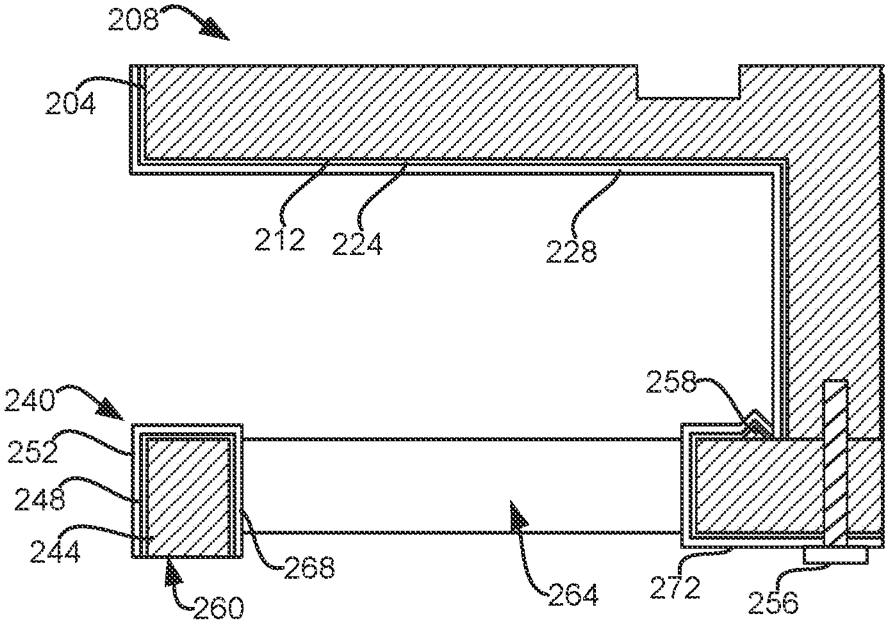

After the plasma spray coating 228 is deposited over the plasma facing surface 212 using a plasma spray, the component 208 may undergo additional processing, such as a cleaning (step 114). In some embodiments, the cleaning may be at least one of a wet cleaning, blasting, or providing of energy, such as ultrasonic or megasonic energy. In this embodiment, the component 208 is attached to another component to form a C-shroud. FIG. 2D is a cross-sectional schematic view of the section of the aluminum component body 204 of the component 208 with the anodized layer 224 and the plasma spray coating 228 on the anodized layer 224, that is mechanically connected to a second C-shroud component 240. The second C-shroud component 240 is a bottom C-shroud component. In this embodiment, the second C-shroud component 240 comprises an aluminum component body 244. An anodized layer 248 is formed over a plasma facing surface of the aluminum component body 244. A plasma spray coating 252 is deposited over the anodized layer 248. The plasma spray coating 272 is applied before the component 208 is mechanically connected to a second C-shroud component 240 to allow a plasma spray head to have access to apply a plasma spray coating.

In this embodiment, one or more bolts 256 are used to mechanically connect the component 208 to the second C-shroud component 240. A bump 258 is placed in front of the location where the component 208 is attached to the second C-shroud component 240. The bump 258 prevents a line-of-sight gap between a plasma region and the seam between the component 208 and the second C-shroud component. A non-plasma facing surface of the second C-shroud component 240 is a bare surface 260. The bare surface 260 is used to electrically connect the aluminum component body 244 to ground. Parts of the non-plasma facing surface of the component 208 are also bare in order to connect the aluminum component body 204 to ground.

In this embodiment, the second C-shroud component 240 has a plurality of apertures. A cross-sectional view of an aperture 264 is shown in FIG. 2D. The aperture 264 is designed to allow process gases, ions, and possibly some plasma to flow from a plasma region to the exhaust. The aperture 264 may be slots or holes. For an aluminum component body 244, small holes with high aspect ratios of depth to width may be formed in the aluminum component body 244. In this embodiment, sidewalls of the aperture 264 are coated with the anodized layer 248 and plasma spray coating 252 forming an aperture sidewall coating 268. Plasma spray coating methods may not sufficiently coat sidewalls of apertures. Such plasma spray coatings may provide a thicker coating closer to the source of the plasma spray coating and thinner or no coating further away from the source of the plasma spray coating. In this embodiment, the plasma spray coating is applied from both the plasma facing surface side and a side opposite the plasma facing surface. As a result, a plasma spray coating 272 is formed on a non-plasma facing surface of the second C-shroud component 240. Masking may be used to provide the bare surface 260. In various embodiments, the apertures 264 may have widths in the range of 0.01 to 5 mm. In other embodiments, the apertures may have a width in the range of 2 to 10 mm. In other embodiments, the non-plasma facing surface is not coated. In some embodiments, parts of the non-plasma facing surface are not coated but are anodized with other parts of the non-plasma facing surface being bare.

Figure 3:
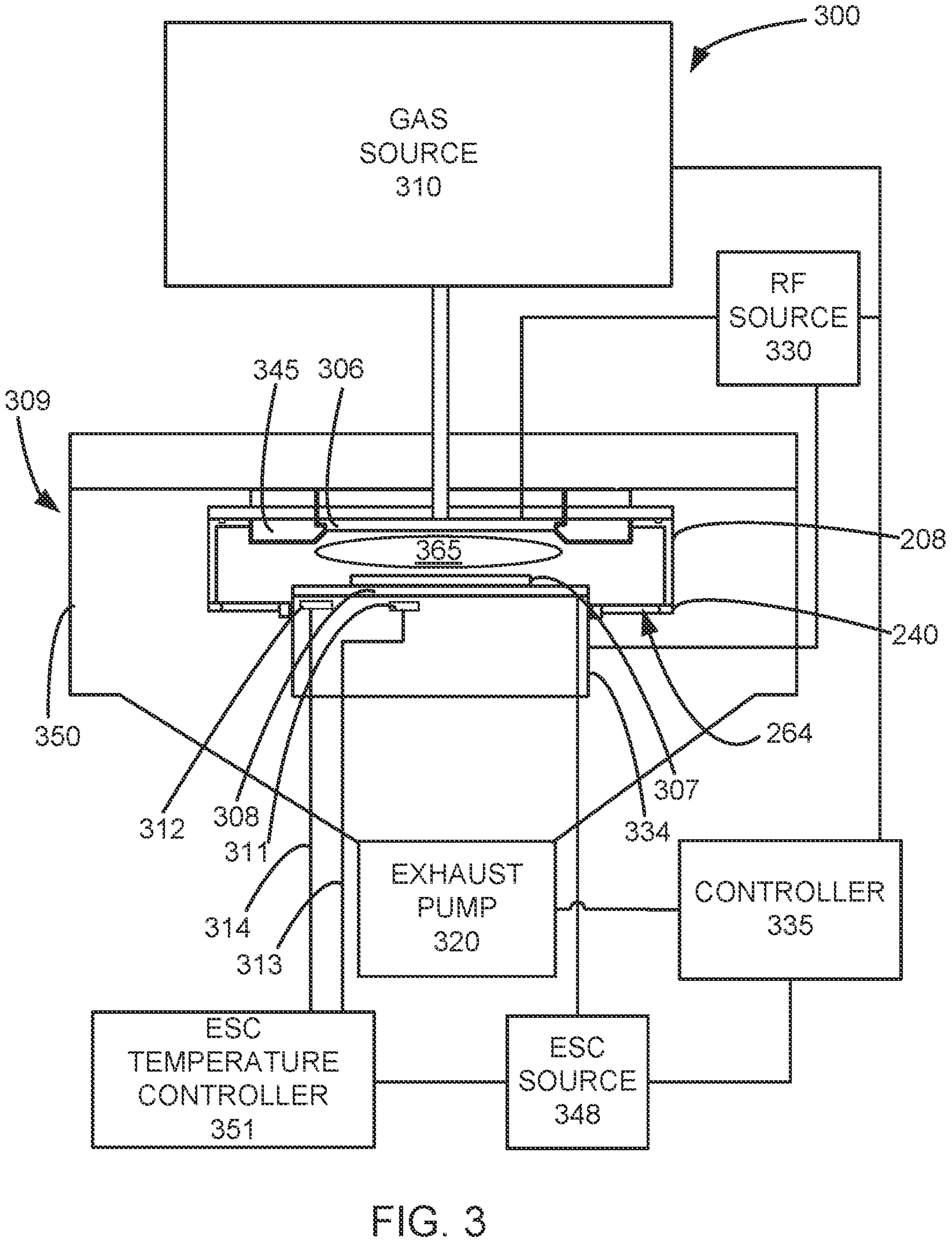
FIG. 3 is a view of a plasma processing chamber that may be used in an embodiment.

The component 208 is mounted in a CCP processing chamber (step 116). FIG. 3 is a schematic view of a plasma processing system in which the component may be installed. In one or more embodiments, the plasma processing system 300 comprises a gas distribution plate 306 providing a gas inlet and an electrostatic chuck (ESC) 308, within a CCP processing chamber 309, enclosed by a chamber wall 350. Within the CCP processing chamber 309, a substrate 307 is positioned on top of the ESC 308. The ESC 308 acts as a substrate support. The ESC 308 may provide a bias from an ESC source 348. A gas source 310 is connected to the CCP processing chamber 309 through the gas distribution plate 306. An ESC temperature controller 351 is connected to the ESC 308 and provides temperature control of the ESC 308. In this example, a first connection 313 provides power to an inner heater 311 for heating an inner zone of the ESC 308. A second connection 314 provides power to an outer heater 312 for heating an outer zone of the ESC 308. An RF source 330 provides RF power to a lower electrode 334 and an upper electrode. In this embodiment, the upper electrode is the gas distribution plate 306 and is grounded. This embodiment also has a grounded outer upper electrode 345. The lower electrode is the ESC 308 and is a capacitively coupled plasma electrode. In a preferred embodiment, 13.56 megahertz (MHz), 2 MHz, 60 MHz, and/or optionally, 27 MHz power sources make up the RF source 330 and the ESC source 348. A controller 335 is controllably connected to the RF source 330, the ESC source 348, an exhaust pump 320, and the gas source 310. A high flow liner is a liner within the CCP processing chamber 309. In this embodiment, the high flow liner is a C-shroud comprising the component 208 and the second C-shroud component 240. The high flow liner confines gas from the gas source. The high flow liner has apertures 264 for maintaining a controlled flow of gas to pass from the gas source 310 to the exhaust pump 320. An example of such a CCP processing chamber is the Exelan Flex™ etch system manufactured by Lam Research Corporation of Fremont, CA. In this example, there is no inductive coupling.

As part of the CCP processing chamber 309, the component 208 is used for processing substrates. In this embodiment, the substrates are processed by providing a plasma etch that deposits a passivation layer (step 120). A plasma 365 is formed by providing a process gas of an etchant and a polymerizing gas and energizing the gas using capacitively coupled plasma radio frequency (RF) power to form the plasma. In this embodiment, the plasma process simultaneously deposits a film on the coating and etches the stack. In this example, a high aspect ratio etch is provided, where a polymer containing sidewall deposition is used. Because the plasma etch process provides a polymer containing sidewall deposition, some of the polymerizing sidewall deposition gas deposits on plasma spray coating 228 forming a deposition film containing a polymer. In some embodiments, a deposition step and an etch step are cyclically repeated a plurality of times.

For high aspect ratio memory stacks such as alternating layers of silicon oxide, silicon nitride, silicon oxide, silicon nitride (ONON), high voltage etches with deposition of a passivation layer are used. The high voltage etching would etch silicon components and the plasma spray coating 228. Etching the plasma spray coating 228 would cause metal contaminant particles. However, in this embodiment providing a polymer containing deposition on the plasma spray coating 228 coating during the etching prevents or reduces the erosion of the plasma spray coating 228. Therefore, this embodiment provides a method and apparatus for providing a high aspect ratio etch of a stack using a high voltage CCP with a plasma facing surface with a yttria coating, with little or no erosion of the plasma spray coating and reduced or no contamination. In some embodiments, the high aspect ratio etch is performed at cryogenic temperatures, such as at temperatures where the substrate is cooled at temperatures below −10° C. In some embodiments, the substrate is cooled to cryogenic temperatures in the range of −80° C. to −20° C. during etching. At cryogenic temperatures byproduct adhesion becomes more of a problem. At such temperatures, byproducts do not adhere to chamber components as well resulting in more flaking and contamination. Some embodiments provide improved roughness tuning compared to silicon parts and improved erosion resistance in order to maintain the roughness for a longer time. In some embodiments, the roughness is tuned to increase byproduct adhesion to reduce contamination. With increased adhesion to reduce contaminants, some embodiments may be used to etch stacks with more than 200 alternating layers.

The deposition of a film during an etch process is not needed to protect coatings in inductively coupled plasma processing. In inductively coupled plasma processing chambers coatings are subjected to much lower voltages than coatings in CCP processing chambers. Because the coatings in the CCP processing chambers are subjected to much higher voltages in a range from 100 eV to 400 eV, the plasma spray coating would be eroded forming particle contaminants. Such a coating would not erode in inductively coupled plasma processing chambers. It has been unexpectedly found that the deposited film during the etching provides sufficient protection of the plasma spray coating when used in a CCP process, where plasma facing surfaces are subjected to electrostatic potential voltages above 100 eV.

In some embodiments, other plasma facing surfaces of plasma confinement components of the CCP processing chamber, such as a plasma facing surface of a grounded electrode, such as the outer upper electrode 345, may be coated with an unsealed anodized layer 224 and the plasma spray coating 228. In some embodiments, the outer upper electrode 345 and the gas distribution plate 306 each comprise an aluminum electrode body with a plasma facing surface and a plasma spray coating over the plasma facing surface.

In some embodiments, the plasma confinement components, such as the C-shroud are placed close to the wafer and electrodes. In some embodiments, the C-shroud is placed closer to the wafer or electrode than the chamber wall is to the C-shroud. Such plasma confinement allows a lower ion energy to be used during processing but also causes the plasma confinement component to be exposed to higher energy ions than the chamber wall.

Presently, such plasma confinement components of a CCP processing chamber may be made of silicon. The reasons for making such components of silicon. The reason for making such components of silicon is that such components are subjected to such high voltages, that the components will be eroded. If silicon parts are eroded during a silicon wafer etch process, the erosion of silicon components does not cause contamination during the substrate processing. Since the silicon part is eroded, the silicon part is a consumable that must be periodically replaced. The consumable silicon parts increase the cost of ownership and increase downtime during the replacement of the consumable silicon parts. In addition, erosion of the consumable silicon parts causes process drift. In order to protect the silicon part, a precoat may be added before each wafer is inserted into the chamber and then a clean process may be used to remove the remaining precoat after a wafer is removed from the chamber. Using a precoat process and a clean process for every wafer processed decreases throughput.

The replacement of consumable silicon parts with an aluminum part with an unsealed anodized layer 224 and the plasma spray coating 228 that is more resistant to erosion in the CCP processing chamber allows for the replacement of a consumable part with a more permanent part. By extending the life of the part or providing a part that lasts for the life of the CCP chamber the cost of ownership can be reduced and the downtime may also be reduced. In addition, the elimination of consumable parts reduces process drift. In addition, since the part is more resistant to erosion, surface roughness has a longer lifetime. If the replacement part contains metal such as aluminum or yttrium and the replacement part is eroded, the eroded aluminum and yttrium will contaminate the processing of the substrate. To prevent such contamination, various embodiments provide components that are more etch erosion resistant. Grounded components in various embodiments are not eroded. If the plasma spray coating 228 was yttria ($Y_2O_3$), instead of yttrium aluminum oxide, such a yttria coating would form yttrium fluoride ($YF_3$) flakes more readily. $YF_3$ flakes are a source of contamination and cause process drift. Non-grounded components that are subjected to a bias in some embodiments are eroded at a faster rate since such components would be subjected to higher voltages.

In other embodiments, the plasma spray coating 228 comprises at least one of spinel ($MgAl_2O_4$ in a cubic crystal system) and lanthanum zirconium oxide (LZO). In other embodiments, the plasma spray coating is applied on a non-anodized surface of an aluminum component body. In some embodiments, the spray coating is applied to a non-anodized surface of an aluminum component body that has a native oxide layer on the surface of the aluminum component body. In some embodiments, a plasma spray coating of at least one of yttria, yttrium fluoride, yttrium oxyfluoride, and magnesium fluoride may be provided over an aluminum component body. Plasma spray coatings provide more easily textured surfaces providing improved deposition adhesion and improved erosion resistance over a silicon component body.

In various embodiments, the plasma spray coating 224 has a thickness of 50 μm to 200 μm inclusive and a roughness of 2 μm to 10 μm RA inclusive. The roughness can be used to facilitate the adhesion of the polymer byproduct to the surface. An increased roughness may be used to increase the adhesion of polymer byproducts to the surface. Increased adhesion prevents polymer from flaking and becoming a contaminant. In addition, increase adhesion may be used to increase the protection of the plasma spray coating 228 by the polymer in order to prevent or reduce erosion. In other embodiments, the plasma spray coating 224 has a thickness of 60 μm to 90 μm inclusive and a roughness of 4 μm to 8 μm RA inclusive.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure. As used herein, the phrase "A, B, or C" should be construed to mean a logical ("A OR B OR C"), using a non-exclusive logical "OR," and should not be construed to mean 'only one of A or B or C. Each step within a process may be an optional step and is not required. Different embodiments may have one or more steps removed or may provide steps in a different order. In addition, various embodiments may provide different steps simultaneously instead of sequentially.

What is claimed is:

1. A component for use in a plasma processing chamber, comprising:
- a metal component body with a plasma facing surface;
- an anodized layer on the plasma facing surface of the metal component body, wherein the anodized layer is unsealed; and
- a plasma spray coating over the anodized layer, wherein the plasma spray coating comprises at least one of yttrium aluminum oxide, spinel (MgAl2O4 in a cubic crystal system), and lanthanum zirconium oxide (LZO).

2. The component, as recited in claim 1, wherein the plasma spray coating has a thickness of 50 μm to 200 μm inclusive and a roughness of 2 μm to 10 μm RA inclusive.

3. The component, as recited in claim 1, wherein the component is grounded.

4. The component, as recited in claim 1, wherein the metal component body comprises aluminum or aluminum alloy and wherein part of a surface of the metal component body is not covered by the anodized layer and the plasma spray coating in order to ground the component.

5. The component, as recited in claim 1, wherein the metal component body is electrically and mechanically connected to a second metal component body.

6. The component, as recited in claim 1, wherein the metal component body comprises aluminum or aluminum alloy, wherein the metal component body has a plurality of apertures with sidewalls, and wherein surfaces of the sidewalls are covered by the anodized layer and the plasma spray coating.

7. The component, as recited in claim 1, wherein the metal component body is part of a capacitively coupled plasma processing chamber.

8. A method for forming and using a component for a plasma processing chamber, comprising:
- providing a metal component body with a plasma facing surface;
- forming an anodized layer over the plasma facing surface of the metal component body, wherein the anodized layer is unsealed; and
- plasma spraying a coating over the anodized layer, while the anodized layer is unsealed, wherein the plasma spray coating comprises at least one of yttrium aluminum oxide, spinel (MgAl2O4 in a cubic crystal system), and lanthanum zirconium oxide (LZO).

9. The method, as recited in claim 8, wherein the coating has a thickness of 50 μm to 100 μm inclusive and a roughness of 2 μm to 10 μm RA inclusive.

10. The method, as recited in claim 8, wherein the metal component body consists essentially of aluminum or aluminum alloy.

11. The method, as recited in claim 8, further comprising mechanically connecting the metal component body with a second metal component body.

12. The method, as recited in claim 8, further comprising installing the component as part of a capacitively coupled plasma processing chamber, wherein the component is grounded and wherein part of the surface of the metal component body is not covered by the anodized layer in order to ground the component.

13. The method, as recited in claim 12, further comprising providing a plasma etch of a stack in the capacitively coupled plasma processing chamber, wherein the plasma etch deposits polymer on the component and the stack while etching the stack, and wherein the component is subjected to a bias of greater than 100 eV.

14. The method, as recited in claim 8, wherein the component is an electrode for capacitive coupling.

* * * * *